United States Patent
Wu et al.

[11] Patent Number: 6,157,566
[45] Date of Patent: Dec. 5, 2000

[54] REDUCED LEAKAGE DRAM STORAGE UNIT

[75] Inventors: Zhiqiang Wu, Meridian; Randhir P S Thakur, Boise; Alan Reinberg, Boise; Kirk Prall, Boise, all of Id.

[73] Assignee: Micron Technology, Inc., Boise, Id.

[21] Appl. No.: 09/550,189

[22] Filed: Apr. 14, 2000

Related U.S. Application Data

[62] Division of application No. 09/426,699, Oct. 25, 1999, which is a continuation of application No. 09/226,785, Jan. 7, 1999, Pat. No. 5,973,954, which is a division of application No. 08/915,425, Aug. 20, 1997, Pat. No. 6,005,801.

[51] Int. Cl.[7] .................................................. G11C 11/40
[52] U.S. Cl. ........................ 365/175; 365/149; 365/174; 365/177; 365/154
[58] Field of Search .................................. 365/145, 149, 365/174, 175, 177, 154, 189.01

[56] References Cited

U.S. PATENT DOCUMENTS

| | | |
|---|---|---|
| 3,739,356 | 6/1973 | Pricer . |
| 3,740,620 | 6/1973 | Agusta et al. . |
| 4,408,303 | 10/1983 | Guterman et al. . |
| 4,922,411 | 5/1990 | Hobbs . |
| 5,331,197 | 7/1994 | Miyawaki et al. . |
| 5,406,523 | 4/1995 | Foss et al. ............................... 365/226 |
| 5,422,305 | 6/1995 | Seabaugh et al. . |
| 5,432,356 | 7/1995 | Imamura . |
| 5,469,399 | 11/1995 | Sato et al. ............................... 365/226 |
| 5,535,156 | 7/1996 | Levy et al. . |
| 5,594,698 | 1/1997 | Freeman . |
| 5,684,748 | 11/1997 | Jang ........................................ 365/201 |
| 5,698,869 | 12/1997 | Yoshimi et al. . |
| 5,801,396 | 9/1998 | Chan et al. . |
| 5,828,620 | 10/1998 | Foss et al. ............................... 365/226 |
| 5,959,878 | 9/1999 | Kamp . |
| 5,973,954 | 10/1999 | Wu et al. ................................. 365/109 |
| 6,005,801 | 12/1999 | Wu et al. . |

FOREIGN PATENT DOCUMENTS

| | | |
|---|---|---|
| 363220565 | 9/1988 | Japan . |
| 407141896 | 6/1995 | Japan . |

*Primary Examiner*—Viet Q. Nguyen
*Attorney, Agent, or Firm*—Kirkpatrick & Lockhart LLP

[57] ABSTRACT

The present invention is directed to a memory cell which comprises a storage node, a switching device for controlling access to the storage node, and a diode between the switching device and the storage node. A method for controlling charge transfer to and from a storage node through a switching device is also disclosed.

22 Claims, 8 Drawing Sheets

REDUCED LEAKAGE DRAM STORAGE UNIT

The present application is a divisional of copending U.S. patent application Ser. No. 09/426,699, filed Oct. 25, 1999, which is a continuation of U.S. patent application Ser. No. 09/226,785, filed Jan. 7, 1999, now U.S. Pat. No. 5,973,954, which is a divisional of U.S. patent application Ser. No. 08/915,425, filed Aug. 20, 1997, now U.S. Pat. No. 6,005,801.

BACKGROUND OF THE INVENTION

FIELD OF THE INVENTION

The present invention is directed generally to dynamic random access memory cells, and, more particularly, to dynamic random access memory cells with a junction device in the storage unit to reduce leakage from the storage unit.

DESCRIPTION OF THE BACKGROUND

Dynamic random access memory (DRAM) devices have become widely accepted in the semiconductor industry. DRAM's typically cost less to produce than other types of memory devices due to their relative simplicity.

At a fundamental level, a DRAM memory cell, or memory bit, consists of one transistor and one capacitor. When the transistor and capacitor are fabricated on a semiconductor substrate, a number of junctions between adjacent materials are formed. Junctions may be classified as homojunctions or heterojunctions. Homojunctions are junctions formed by doping a uniform body of semiconductor material. Thus, doped material adjacent to undoped material, or two adjacent areas of material that are doped differently from one another, form homojunctions. Heterojunctions are formed by two different semiconductor materials which are adjacent.

One way to understand a junction is to examine the electron energy band diagram for the junction. Such a diagram illustrates the energy band levels of the materials of the junction with the potential barrier between the two sides of the junction being indicative of the degree of difficulty an electron will have in traveling from one side to the other. The larger the barrier, the greater the degree of difficulty.

It is known that the size of the barrier, i.e., the characteristics of the junction, can be varied by the application of electric fields. Thus, under certain circumstances, the barrier may be large while under others the barrier may be small. Those characteristics have enabled heterojunction devices to act as storage devices. See, for example, U.S. Pat. No. 3,740,620 entitled "Storage System Having Heterojunction—Homojunction Devices", and U.S. Pat. No. 3,739,356 entitled "Heterojunction Information Storage Unit."

DRAM devices are typically fabricated of homojunctions. To enable a quick read to or write from the memory cell, it is desirable to have a small electron barrier. However, small electron barriers mean high leakage rates, i.e. electrons traveling across the barrier when they aren't supposed to. Thus, there is an engineering tradeoff between speed and leakage rates.

DRAM cells of the prior art all exhibit charge leakage such that the information stored in the cell must be periodically refreshed. The more often the cell is refreshed, the slower the memory operates and the more power it consumes. High frequency refresh operations also introduce noise into the array. Thus, the need exists for a DRAM memory circuit that has reduced charge leakage from the storage node. That translates into a lower refresh frequency, higher operating speeds, and lower power consumption.

SUMMARY OF THE INVENTION

The present invention, according to its broadest implementation, is directed to a memory cell which incorporates a diode between a switching device and a storage node to reduce charge leakage from the storage node.

The present invention also contemplates a solid state memory cell which comprises a storage capacitor, a transistor, and a junction fabricated between the storage capacitor and the transistor. The present invention further contemplates an array of such memory cells comprised of a plurality of column lines and row lines interconnecting the memory cells and a plurality of sense amplifiers and precharge circuits connected between the column lines.

The present invention may also be part of a complete memory device which itself may be part of a system. The system may comprise a processor, read and write control logic, a plurality of memory cells, a plurality of column lines and row lines interconnecting the plurality of memory cells, and a plurality of sense amplifiers and precharge circuits connected between the column lines.

The present invention also contemplates a method of controlling charge transfer to and from a storage node through a switching device.

The present invention represents a substantial advance over prior memory cells and methods of controlling charge transfer to and from a storage node through a switching device. Because the present invention incorporates a diode between the switching device and the storage node, the leakage from the storage node is reduced and memory refresh frequency is reduced. Those advantages and benefits of the present invention, and others, will become apparent from the Detailed Description of the Invention hereinbelow.

BRIEF DESCRIPTION OF THE DRAWINGS

For the present invention to be clearly understood and readily practiced, the present invention will be described in conjunction with the following figures, wherein:

FIG. 6 is an electron energy band diagram of the preferred embodiment of the present invention of FIG. 4 as depicted when the row line is on;

FIG. 9 is an electron energy band diagram of the preferred embodiment of the present invention of FIG. 7 as depicted when the row line is on;

FIG. 12 is an electron energy band diagram of the preferred embodiment of the present invention of FIG. 10 as depicted when the row line is on.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical memory system. Those of ordinary skill in the art will recognize that other elements are desirable and/or required to implement the present invention. However, because such elements are well known in the art, and because they do not facilitate a better understanding of the present invention, a discussion of such elements is not provided herein.

Figure 1:
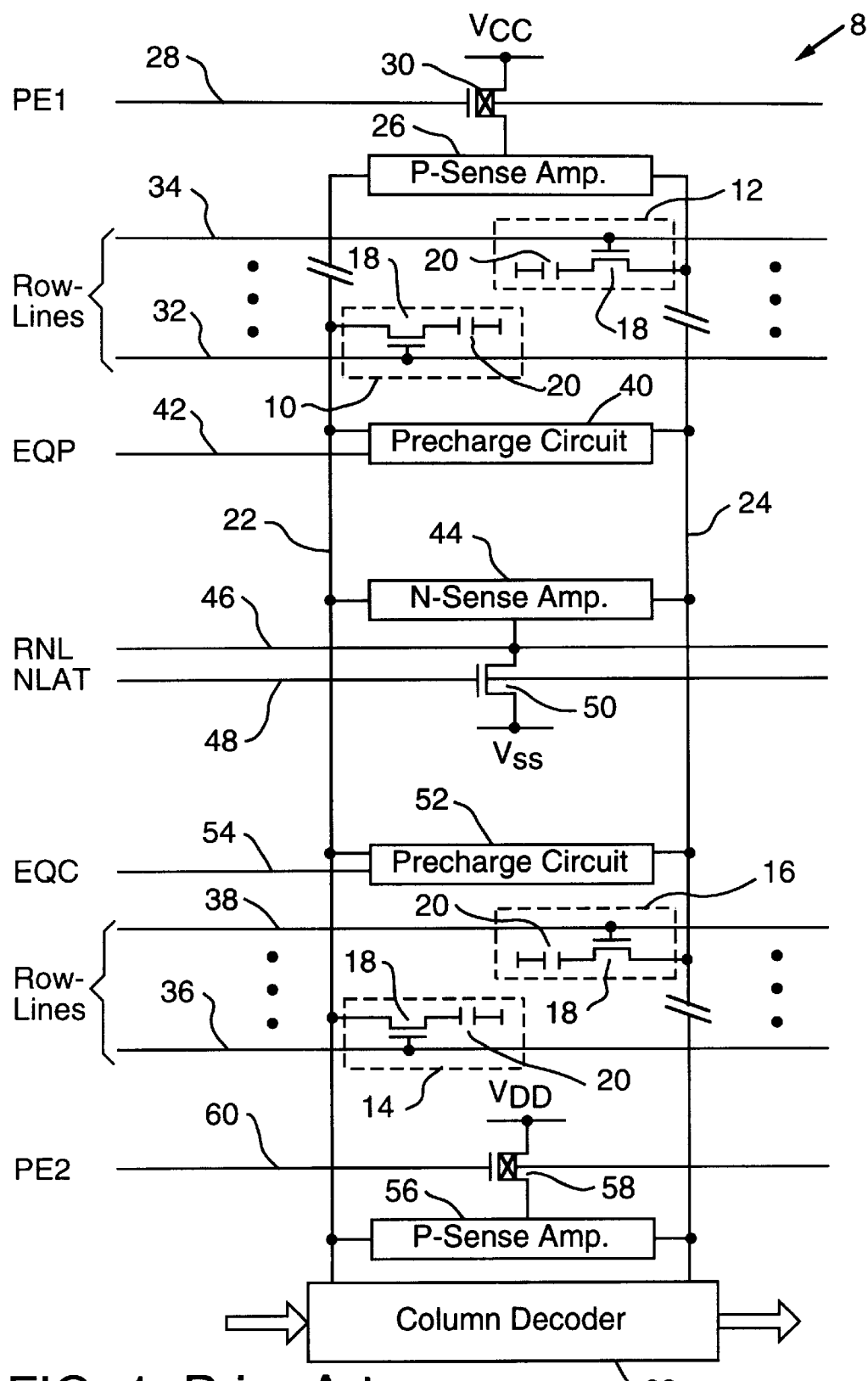
FIG. 1 is a circuit diagram of a prior art DRAM array.

A portion of a schematic of a typical prior art DRAM array 8 is shown in FIG. 1. Four memory cells 10, 12, 14, and 16 are shown in FIG. 1. The cells 10, 12, 14, and 16 are connected in rows to row lines, or word lines, and are connected in columns to column lines, or digit lines. Each cell in the array 8 is identified by a binary row address and a binary column address. The array 8 as depicted in FIG. 1 is comprised of four digit lines which make up two column lines.

As can be seen in FIG. 1, each of the memory cells 10, 12, 14 and 16 is comprised of a transistor 18 and a capacitor 20. Information, generally an intermediate voltage value that is between the voltage values for a logic "1" or a logic "0", is stored in the capacitor 20. Such voltage values may be, for example, Vcc/2 and –Vcc/2, respectfully. The stored value is an intermediate value because of the resistive and capacitive effects of the memory array 8. A first column line 22 and a second column line 24 comprise a pair of column lines, which is sometimes referred to as a column.

A P-sense amplifier 26 acts as an active pull-up circuit. It is enabled by PE1 signal 28 through device 30, and provides a pull-up voltage to the column lines 22 and 24.

The cells 10, 12, 14 and 16 are connected to and enabled by row lines 32, 34, 36 and 38, respectively. Only one of the row lines 32, 34, 36 and 38 is active at a time. When each of the active row lines 32, 34, 36 and 38 is active, the row line connects the respective cell to either the column line 22 or the column line 24.

A precharge circuit 40, which is enabled by EQP signal 42, establishes equilibration voltages and set-up conditions on the digit lines 22 and 24. An N-sense amplifier 44 acts as an active pull-down circuit. It is enabled by the RNL signal 46 and NLAT signal 48 through device 50, and provides a pull-down voltage to the column lines 22 and 24.

Precharge circuit 52 is enabled by EQC signal 54. The precharge circuit 52 operates similarly to the precharge circuit 40. P-sense amplifier 56 is enabled through device 58 by PE2 signal 60. The P-sense amplifier 56 operates similarly to the P-sense amplifier 26. Column decoder 62 selects a column to be addressed in the array 8.

Figure 2:
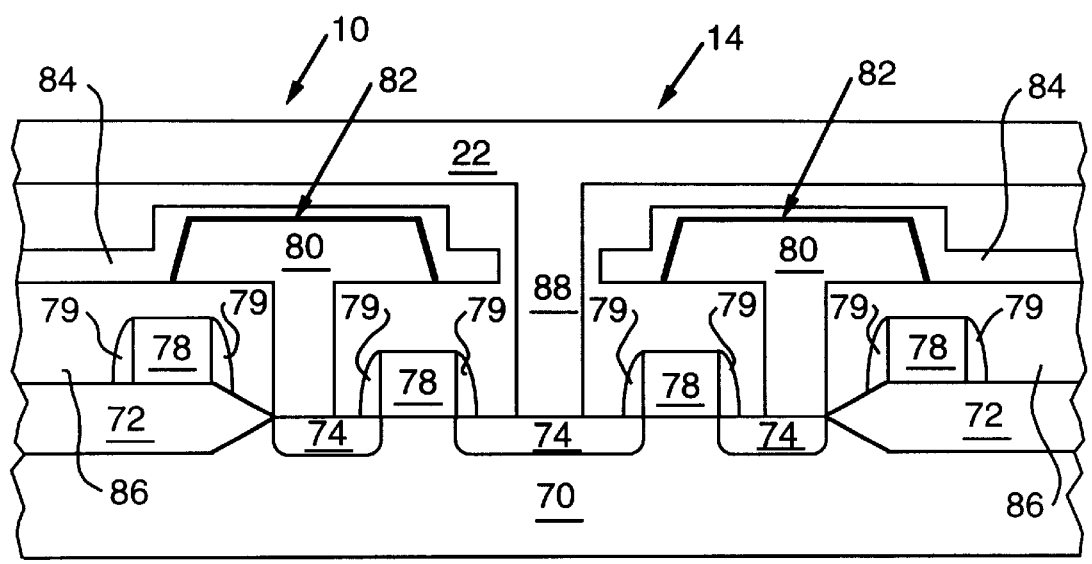
FIG. 2 is a cross section of a physical layout of the prior art DRAM array of FIG. 1.

FIG. 2 shows a cross section of the physical layout of the memory cells 10 and 14 from FIG. 1. If the cross section shown in FIG. 2 were divided roughly in half along a vertical axis, the memory cell 10 would be to the left of the bisection and the memory cell 14 would be to the right of the bisection. The memory cells 10 and 14 are constructed on a substrate 70, typically a silicon substrate. Field oxide regions 72 are grown on the substrate 70, typically by a LOCOS process, and active areas 74 are diffused into the substrate 70.

Gate access regions 78 are typically constructed of polysilicon. The gate access regions 78 are surrounded at their sides by spacer regions 79. Storage nodes 80 are constructed of polysilicon, and function as the storage areas for the capacitors 20 of FIG. 1.

Dielectric layers 82 are formed on top of the storage nodes 80. The dielectric layers 82 are typically constructed of an oxide-nitride-oxide (ONO) dielectric. The thickness of the dielectric layers 82 is chosen such that maximum capacitance is obtained and charge leakage is reduced in order to optimize refresh. Cellplates 84, which are typically constructed of polysilicon, form top plates over the dielectric layers 82. The cellplates 84 are shared by all capacitors in a row line. The cellplates 84, the dielectric layers 82, and the storage nodes 80 comprise the capacitors 20 of FIG. 1. Insulator regions 86 surrounding the storage nodes 80 and the cellplates 84 are typically constructed of an insulative material, such as silicon dioxide. The column line 22 (digitline) is typically constructed of metal and digitline contact 88 is formed using conventional metal plug technology.

The cross section shown in FIG. 2 is a typical layout of a buried capacitor cell design. Other types of cell configurations, including buried digitline cell and trench cell layouts, have similar storage node configurations.

Due to the inherent physical properties of the memory cells 10 and 14 of FIG. 2, the capacitors 20 exhibit charge leakage. Thus, the stored values in the memory cells 10 and 14 must be periodically refreshed to prevent the stored voltage values from becoming logically indistinguishable. Higher frequencies of memory cell refresh means that noise is introduced into the array more frequently. Also, higher refresh frequencies generally translate into slower array operating speeds and higher power consumption.

Figure 3A:
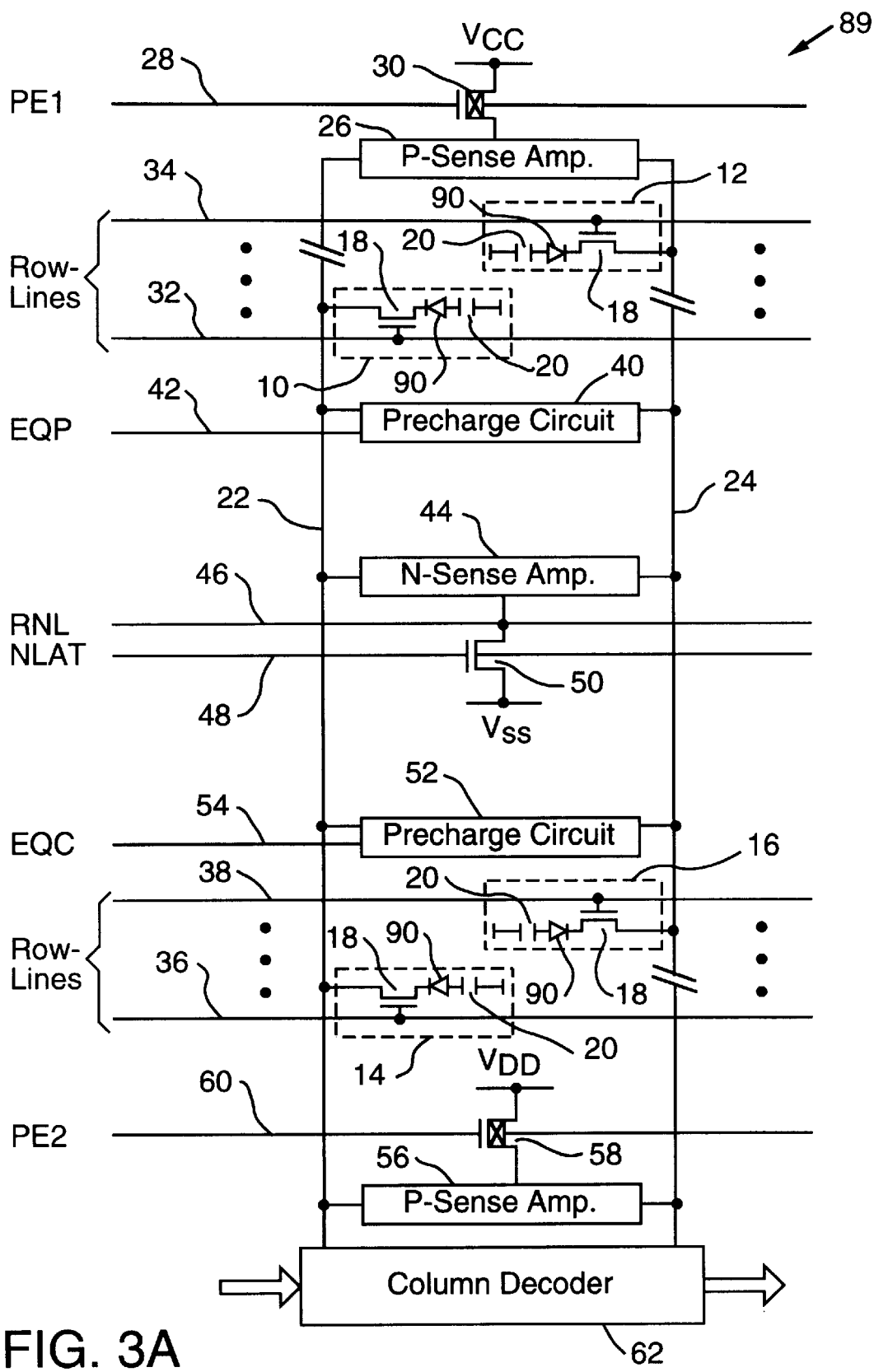
FIG. 3A is a circuit diagram of a preferred embodiment of the present invention.

FIG. 3A shows a circuit schematic of a preferred embodiment of the present invention which addresses the leakage problem found in prior art devices. Memory array 89 is comprised of a plurality of memory cells, four of which 10, 12, 14 and 16 are illustrated in the figure. The array 89 operates similarly to the array 8 described hereinabove in conjunction with FIG. 1. However, the memory cells 10, 12, 14 and 16 in FIG. 3A are each comprised of a transistor 18, a capacitor 20, and a homojunction diode 90 connected in series between the capacitor 20 and the transistor 18. The diode 90 functions similarly to a conventional diode and is depicted as such in FIG. 3A. It can be understood by those skilled in the art that the diode 90 may be a conventional diode or, for example, a unitary heterojunction device.

Figure 3B:
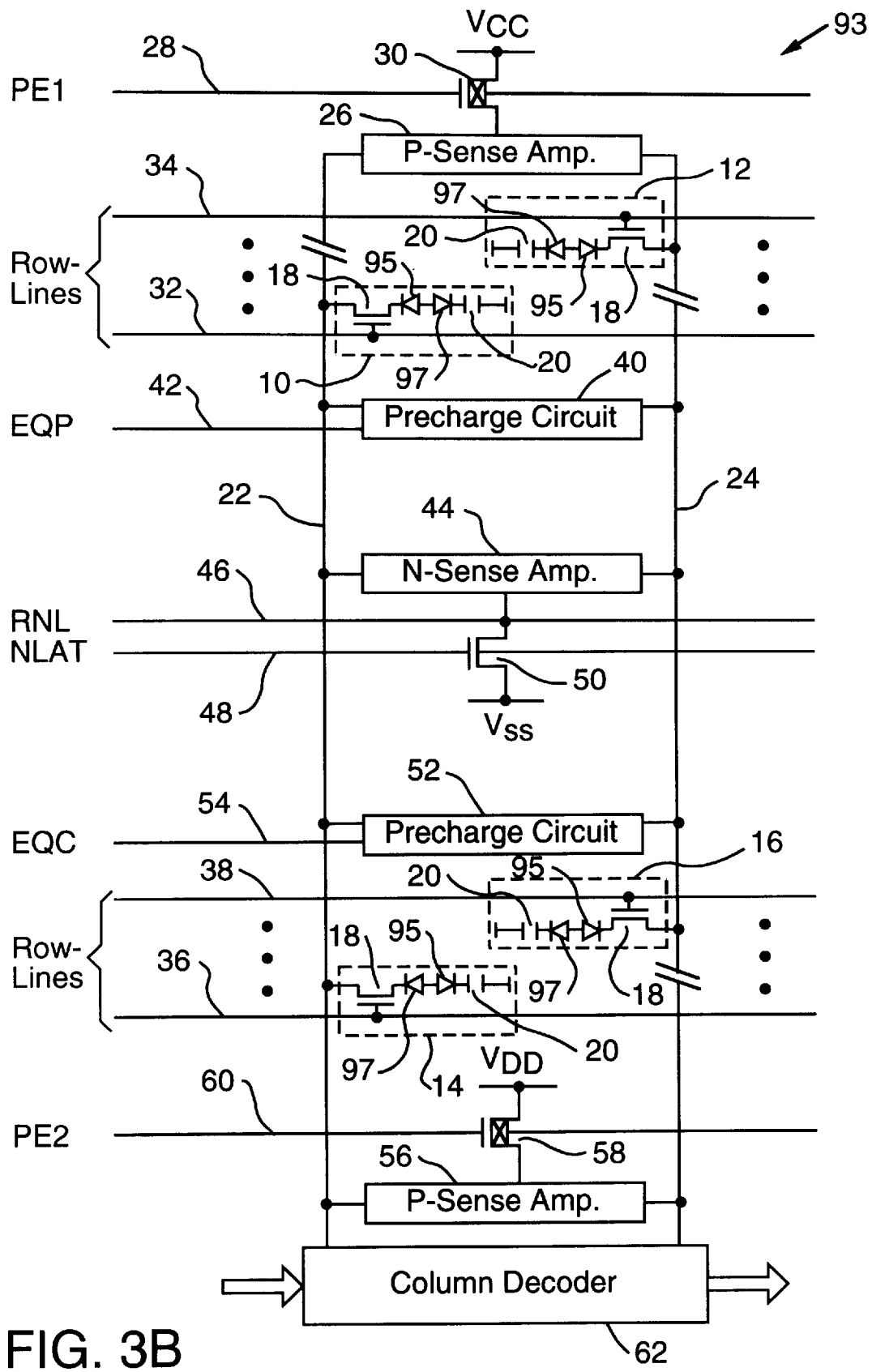
FIG. 3B is a circuit diagram of another preferred embodiment of the present invention.

FIG. 3B shows a circuit schematic of another preferred embodiment of the present invention. Memory array 93 is comprised of a plurality of memory cells, four of which 10, 12, 14, and 16 are illustrated in this figure. The array 93 operates similarly to the array 8 described hereinabove in conjunction with FIG. 1. However, the memory cells 10, 12, 14, and 16 in FIG. 3B are each comprised of a transistor 18, a capacitor 20, and homojunction diodes 95 and 97 connected in series between the capacitor 20 and the transistor 18. The diodes 95 and 97 function similarly to conventional diodes and are depicted as such in FIG. 3B. It can be understood by those skilled in the art that the diodes 95 and 97 may be conventional diodes or, for example, unitary heterojunction devices.

Figure 4:
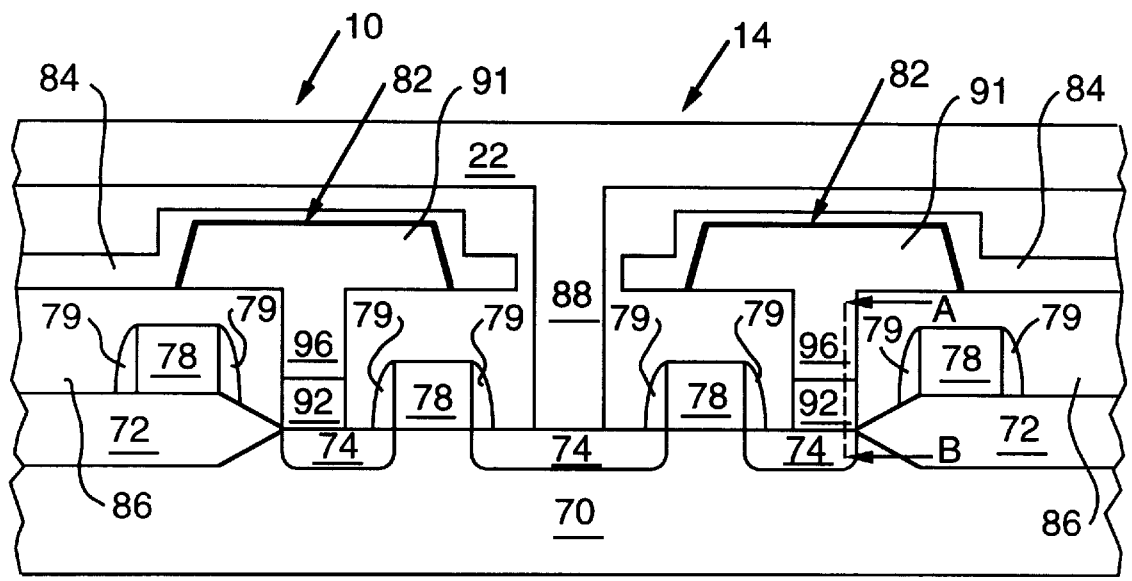
FIG. 4 is a cross section of a physical layout of a preferred embodiment of two memory storage cells which incorporate a diode in the storage nodes.

FIG. 4 illustrates a cross section of the physical layout of a preferred embodiment of the memory cells 10 and 14 of FIG. 3B. The physical layouts of the memory cells 10 and 14 are similar to those described hereinabove in conjunction with FIG. 2. However, in the embodiment shown in FIG. 4, storage nodes 91 are comprised of three regions—doped p-type silicon regions 92, polysilicon regions 94, and doped n-type regions 96. The active areas 74 are doped n-type regions. The homojunction p-n junctions formed by the regions 92 and 96 act as diodes which substantially reduce the number of electrons escaping from or entering into the storage nodes 91 while the gate access devices 78 are off.

Figure 5:
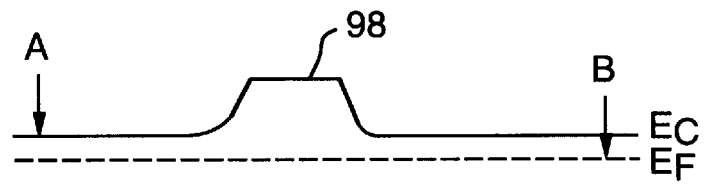
FIG. 5 is an electron energy band diagram of the preferred embodiment of the present invention of FIG. 4 as depicted when the row line is off.

FIG. 5 illustrates an electron energy band diagram of the preferred embodiment of the present invention of FIG. 4 as depicted when the gate access devices 78 are off. The diagram of FIG. 5 illustrates the energy band gap characteristics of a cross section of the storage node 91 of the memory cell 14 along the line A–B in FIG. 4. The band gap between the conduction band ($E_C$) and the valance band ($E_V$) is approximately 1.1 eV. The barrier portion 98 of the conduction band $E_C$, which corresponds to the p-n junction of the storage node 91, acts as a barrier which substantially reduces the number of electrons leaking out of or into the storage node 91 while the memory cell 14 is not being accessed.

Figure 6:
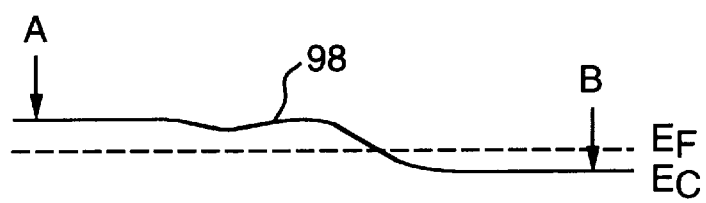

FIG. 6 illustrates an electron energy band diagram of the preferred embodiment of the present invention of FIG. 4 as depicted when the gate access device 78 of the cell 14 is on. The diagram of FIG. 6 illustrates the energy band gap characteristics of a cross section of the storage node 91 of the memory cell 14 along the line A–B in FIG. 4. When the gate access device 78 is on, the conduction band $E_C$ is bent towards the Fermi level band $E_F$ and the barrier portion 98 is reduced. Thus, electrons may move freely between the storage node 91 and the active area 74 and the contents of the storage node 91 will appear on the digit line contact 88 during a read operation.

Figure 7:
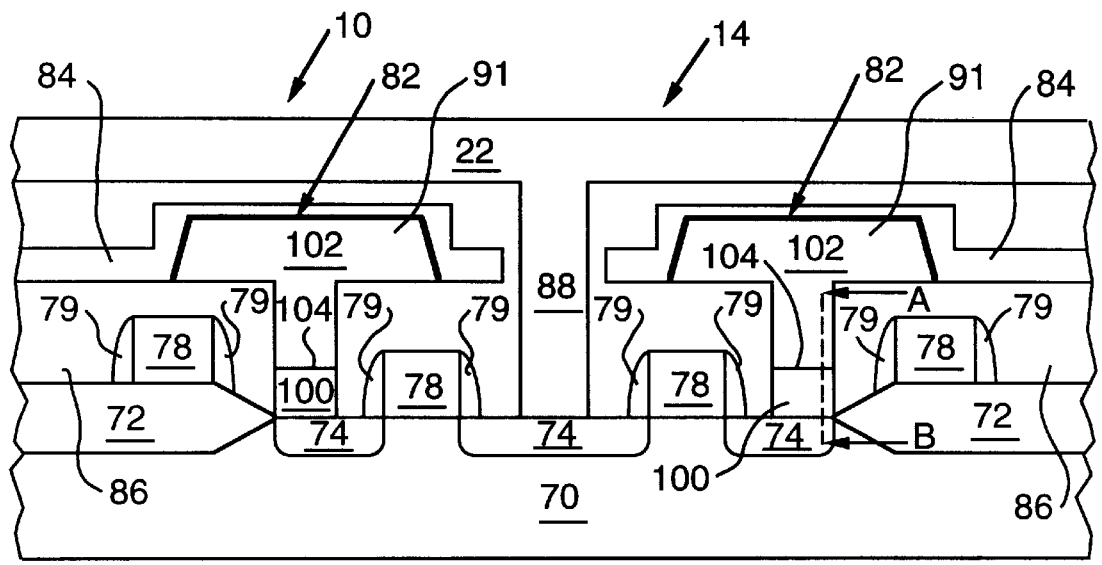
FIG. 7 is a cross section of a physical layout of a preferred embodiment of two memory storage cells which incorporate a heterojunction device in the storage nodes.

FIG. 7 illustrates a cross section of the physical layout of another preferred embodiment of the memory cells 10 and 14 of FIG. 3. The physical layouts of the memory cells 10 and 14 are similar to those described hereinabove in conjunction with FIG. 2. However, storage nodes 91 are comprised of two regions—polysilicon regions 100 and polycrystalline SiGe regions 102. The chemical formula for the polycrystalline SiGe which comprise the regions 102 are a variation of $Si_xGe_{1-x}$, where x is a number between 0 and 1. In a preferred embodiment of the present invention, the value of x is chosen from the range of values between 0.5 and 1. In another preferred embodiment of the present invention, the polycrystalline SiGe regions 102 are comprised of approximately 50% Si and approximately 50% Ge. The interface between the polysilicon regions 100 and the SiGe regions 102 form heterojunctions 104. The heterojunctions 104 form potential barriers which substantially reduce the number of electrons escaping or entering into the storage nodes 91 while the gate access devices 78 are off. Proper reading and writing of the memory cells 10 and 14 can be performed because of the influence of the gate access devices 78, which bend the conduction/valence band near the heterojunctions 104 so that the potential barrier is reduced.

It can be understood by those skilled in the art that the heterojunction 104 can be formed by joining other types of semiconductor materials than those described above. Typically, heterojunctions can be formed by growing a compound semiconductor material, such as a III–IV or a II–VI compound, on an elementary semiconductor material such as germanium or silicon.

Figure 8:
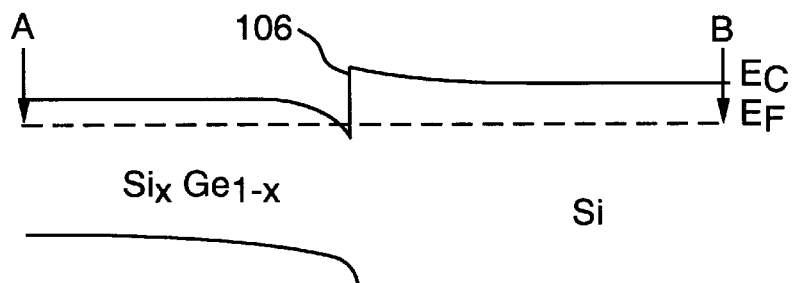
FIG. 8 is an electron energy band diagram of the preferred embodiment of the present invention of FIG. 7 as depicted when the row line is off.

FIG. 8 illustrates an electron energy band diagram of the preferred embodiment of the present invention of FIG. 7 as depicted when the gate access devices 78 are off. The diagram of FIG. 8 illustrates the energy band gap characteristics of a cross section of the storage node 91 of the memory cell 14 along the line A–B in FIG. 7. The band gap between the conduction band ($E_C$) and the valence band ($E_V$) at the cross-section A, corresponding to $Si_xGe_{1-x}$, is approximately 0.8 eV. The band gap difference between the conduction band $E_C$ and the valence band $E_C$ at the cross-section B, corresponding to Si, is approximately 1.1 eV. The barrier portion 106 of the conduction band $E_C$, which corresponds to the heterojunction 104 of the storage node 91, is a barrier which substantially reduces the number of electrons leaking out of or into the storage node 91 while the memory cell 14 is not being accessed. The barrier portion 106 represents a barrier of approximately 0.2 eV.

Figure 9:
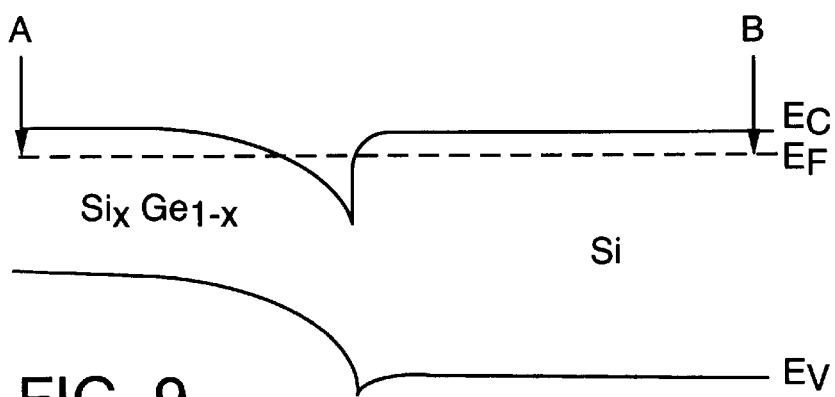

FIG. 9 illustrates an electron energy band diagram of the preferred embodiment of the present invention of FIG. 4 as depicted when the gate access device 78 of the cell 14 is on. The diagram of FIG. 6 illustrates the energy band gap characteristics of a cross section of the storage node 91 of the memory cell 14 along the line A–B. When the gate access device 78 is on, the conduction band $E_C$ is bent toward the Fermi level band $E_F$, such that the barrier portion 106 is reduced. Thus, electrons may move freely between the storage node 91 and the active area 74 and the contents of the storage node 91 will appear on the digit line contact 88 during a read operation.

Figure 10:
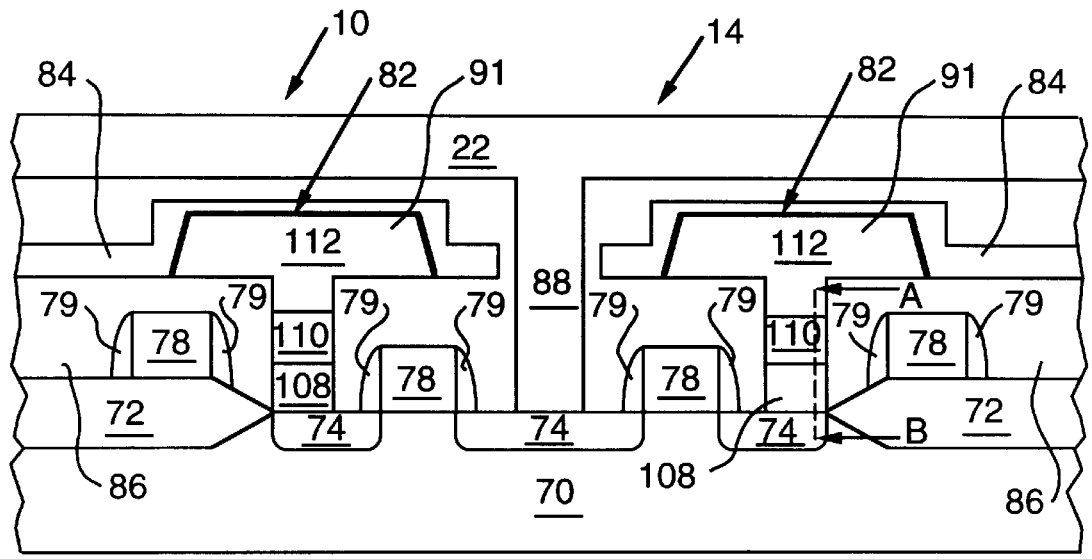
FIG. 10 is a cross section of a physical layout of a preferred embodiment of two memory storage cells which incorporate a multiple superlattice device in the storage nodes.

FIG. 10 illustrates a cross section of the physical layout of another preferred embodiment of the memory cells 10 and 14 of FIG. 3. The physical layouts of the memory cells 10 and 14 are similar to those described hereinabove in conjunction with FIG. 2. However, the storage nodes 91 are constructed as a multiple superlattice. The storage nodes 91 are comprised of three regions—SiGe regions 108, silicon regions 110, and SiGe regions 112. The regions 108, 110 and 112 act as diodes which substantially reduce the number of electrons escaping from or entering into the storage nodes 91 while the gate access devices 78 are off.

Figure 11:
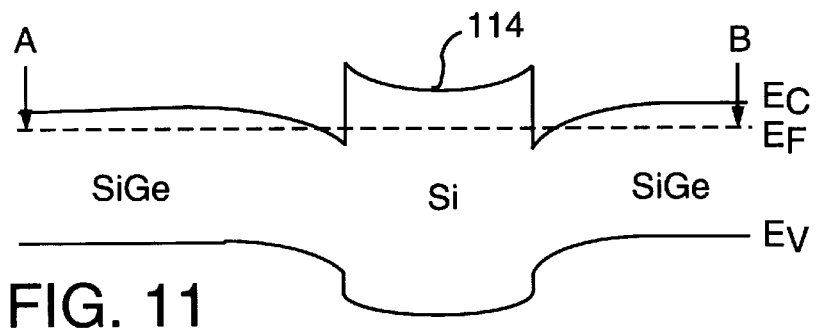
FIG. 11 is an electron energy band diagram of the preferred embodiment of the present invention of FIG. 10 as depicted when the row line is off.

FIG. 11 illustrates an electron energy band diagram of the preferred embodiment of the present invention of FIG. 10 as depicted when the gate access devices 78 are off. The diagram of FIG. 11 illustrates the energy band gap characteristics of a cross section of the storage node 91 of the memory cell 14 along the line A–B in FIG. 10. The band gap between the conduction band ($E_C$) and the valence band ($E_V$) at the SiGe cross-sections A and B is approximately 0.8 eV. The band gap between the conduction band $E_C$ and the valence band $E_V$ the Si cross-section is approximately 1.1 eV. The barrier portion 114 of the conduction band $E_C$ is a barrier which substantially reduces the number of electrons leaking out of or into the storage node 91 while the memory cell 14 is not being accessed.

Figure 12:
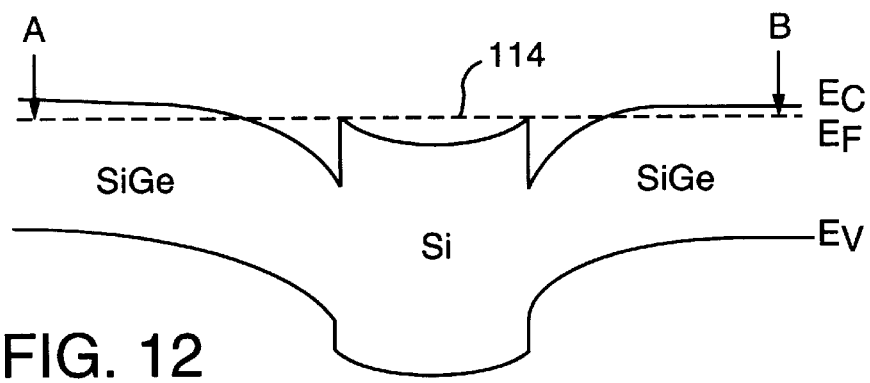

FIG. 12 illustrates an electron energy band diagram of the preferred embodiment of the present invention of FIG. 10 as depicted when the gate access device 78 of the cell 14 is on. The diagram of FIG. 12 illustrates the energy band gap characteristics of a cross section of the storage node 91 of the memory cell 14 along the line A–B. When the gate access device 78 is on, the conduction band $E_C$ is bent toward and below the Fermi level band $E_F$, such that the barrier portion 114 is reduced. Thus, electrons may move freely between the storage node 91 and the active area 74 and the contents of the storage node 91 will appear on the digit line contact 88 during a read operation.

Figure 13:
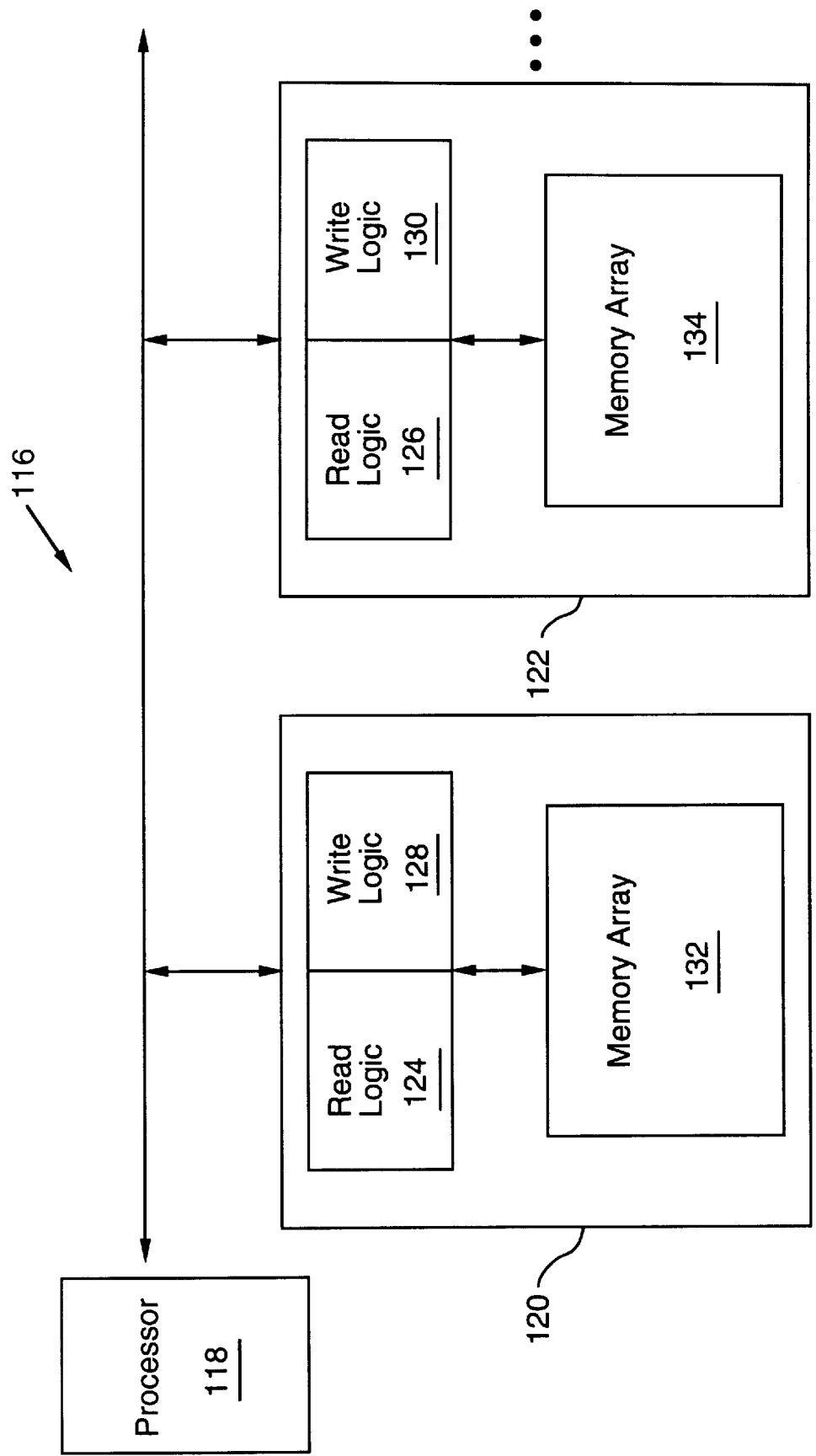
FIG. 13 shows a system in which the reduced leakage memory cells of the present invention may be incorporated.

FIG. 13 shows a system 116 in which the reduced leakage memory cells of the present invention may be incorporated. A processor 118 is connected to memory devices 120 and 122. Each memory device 120 and 122 is comprised of read logic circuits 124 and 126, write logic circuits 128 and 130, and memory arrays 132 and 134, respectively. The read logic circuits 124 and 126 are used to control a read out of the memory devices 120 and 122. The write logic circuits 128 and 130 are used to control a write to the memory device 120 and 122. The memory arrays 132 and 134 are of the type of array 89 shown in FIG. 3.

The present invention also contemplates a method of controlling charge transfer to or from a storage node through a switching device such as a transistor. The method, in its broadest form, is comprised of the steps of placing a charge on the control terminal of the switching device to access the storage node. The charge establishes a first potential barrier between a conduction terminal of the switching device and the storage node. The charge is removed from the control terminal to end access to the storage node. When the charge is removed, a second potential barrier is created between the conduction terminal and the storage node which is larger than the first potential barrier.

The present invention has the benefit of reducing the charge leakage from the storage nodes of DRAM circuits. The reduced charge leakage results in a lower refresh frequency, higher operating speeds, and lower power consumption.

Although the preferred embodiments of the present invention have been described using silicon on substrate technology, it can be understood by those of ordinary skill in the art that the invention may be practiced using any standard processes, machines and technology.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A solid state memory cell, comprising:
   a storage node;
   a switching device connected to the storage node; and
   first and second diodes connected in series between the storage node and the switching device.

2. The memory cell of claim 1, wherein the storage node includes a portion of a capacitor.

3. The memory cell of claim 1, wherein the switching device includes first and second terminals defining a conduction path, and wherein the switching device includes a control terminal.

4. The memory cell of claim 3, wherein the first terminal of the switching device is connected to a column line, the second terminal is connected to the storage node, and the control terminal is connected to a row line.

5. The memory cell of claim 4, wherein the switching device includes a transistor having homojunctions.

6. The memory cell of claim 3, wherein the first and second diodes each include an anode terminal and a cathode terminal, and wherein the cathode terminal of the first diode is connected to the second terminal of the switching device, the anode terminal of the first diode is connected to the anode terminal of the second diode, and the cathode terminal of the second diode is connected to the storage node.

7. The memory cell of claim 6, wherein the first and second diodes each include a homojunction.

8. The memory cell of claim 7, wherein each of the homojunctions has a potential barrier value of approximately 0.5 eV.

9. The memory cell of claim 6, wherein the first and second diodes each include a heterojunction.

10. The memory cell of claim 9, wherein each of the heterojunctions has a potential barrier value of 0.2 eV.

11. The memory cell of claim 9, wherein each of the heterojunctions include a first region of polycrystalline SiGe, a region of silicon, and a second region of polycrystalline SiGe.

12. The memory cell of claim 11, wherein the first and second regions of polycrystalline SiGe have the formula $Si_xGe_{1-x}$, wherein $0<x<1$.

13. A solid state memory cell, comprising:
    a storage node;
    a first diode having an anode terminal and a cathode terminal, wherein the cathode terminal is connected to the storage node;
    a second diode having an anode terminal and a cathode terminal, wherein the anode terminal of the second diode is connected to the anode terminal of the first diode; and
    a switching device having a control terminal and a conduction path between first and second terminals, wherein the first terminal is connected to a column line, the second terminal is connected to the cathode terminal of the second diode, and the control terminal is connected to a row line.

14. An array of memory cells, comprising:
    a plurality of column lines;
    a plurality of row lines; and
    a plurality of solid state memory cells, wherein each memory cell includes:
      a storage node;
      a switching device connected to the storage node; and
      first and second diodes connected in series between the storage node and the switching device.

15. The array of claim 14, wherein the switching device includes a control terminal and a conduction path between first and second terminals, wherein the first terminal is connected to one of the plurality of the column lines, the second terminal is connected to the storage node, and the control terminal is connected to one of the plurality of row lines.

16. The array of claim 15, wherein the first and second diodes each include an anode terminal and a cathode terminal, and wherein the cathode terminal of the first diode is connected to the second terminal of the switching device, the anode terminal of the first diode is connected to the anode terminal of the second diode, and the cathode terminal of the second diode is connected to the storage node.

17. A memory device, comprising:
    a read control logic circuit;
    a write control logic circuit; and
    an array of memory cells connected to the read control logic circuit and the write control logic circuit, wherein the array includes:

a plurality of column lines;
a plurality of row lines; and
a plurality of solid state memory cells, wherein each memory cell includes:
a storage node;
a switching device connected to the storage node; and
first and second diodes connected in series between the storage node and the switching device.

18. The device of claim 17, wherein the switching device includes a control terminal and a conduction path between first and second terminals, wherein the first terminal is connected to one of the plurality of the column lines, the second terminal is connected to the storage node, and the control terminal is connected to one of the plurality of row lines.

19. The device of claim 18, wherein the first and second diodes each include an anode terminal and a cathode terminal, and wherein the cathode terminal of the first diode is connected to the second terminal of the switching device, the anode terminal of the first diode is connected to the anode terminal of the second diode, and the cathode terminal of the second diode is connected to the storage node.

20. A system, comprising:
a processor; and
a memory device, wherein the memory device includes:
a read control logic circuit;
a write control logic circuit; and
an array of memory cells connected to the read control logic circuit and the write control logic circuit, wherein the array includes:
a plurality of column lines;
a plurality of row lines; and
a plurality of solid state memory cells, wherein each memory cell includes:
a storage node;
a switching device connected to the storage node; and
first and second diodes connected in series between the storage node and the switching device.

21. The system of claim 20, wherein the switching device includes a control terminal and a conduction path between first and second terminals, wherein the first terminal is connected to one of the plurality of the column lines, the second terminal is connected to the storage node, and the control terminal is connected to one of the plurality of row lines.

22. The system of claim 21, wherein the first and second diodes each include an anode terminal and a cathode terminal, and wherein the cathode terminal of the first diode is connected to the second terminal of the switching device, the anode terminal of the first diode is connected to the anode terminal of the second diode, and the cathode terminal of the second diode is connected to the storage node.

* * * * *

UNITED STATES PATENT AND TRADEMARK OFFICE
CERTIFICATE OF CORRECTION

PATENT NO. : 6,157,566
DATED : December 5, 2000
INVENTOR(S) : Wu et al.

It is certified that error appears in the above-identified patent and that said Letters Patent is hereby corrected as shown below:

COLUMN 6

Line 21, after the phrase "valence band", delete "$E_c$" and substitute "$E_v$" therefor.

Signed and Sealed this

Eighth Day of May, 2001

Attest:

NICHOLAS P. GODICI

Attesting Officer

Acting Director of the United States Patent and Trademark Office